US008773853B2

(12) United States Patent
Tsai et al.

(10) Patent No.: US 8,773,853 B2
(45) Date of Patent: Jul. 8, 2014

(54) FAN MOUNTING APPARATUS FOR HEAT DISSIPATION

(75) Inventors: Lung-Sheng Tsai, New Taipei (TW); Yao-Chung Chen, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 92 days.

(21) Appl. No.: 13/400,710

(22) Filed: Feb. 21, 2012

(65) Prior Publication Data

US 2012/0318953 A1 Dec. 20, 2012

(30) Foreign Application Priority Data

Jun. 14, 2011 (TW) ................................ 100120678

(51) Int. Cl.
*H05K 7/20* (2006.01)

(52) U.S. Cl.
USPC .......................................... 361/695; 454/184

(58) Field of Classification Search
USPC ................ 248/638, 274.1; 415/213.1, 213.4; 454/184; 361/679.46, 679.48, 679.57, 361/679.58, 695
See application file for complete search history.

(56) References Cited

U.S. PATENT DOCUMENTS

| | | | | |
|---|---|---|---|---|
| 5,788,566 | A * | 8/1998 | McAnally et al. ............ | 454/184 |
| 7,688,585 | B2 * | 3/2010 | Yin .............................. | 361/695 |
| 7,697,287 | B2 * | 4/2010 | Yin .............................. | 361/695 |
| 8,075,248 | B2 * | 12/2011 | Yin et al. ........................ | 415/60 |
| 8,177,504 | B2 * | 5/2012 | Zhang et al. ............... | 415/213.1 |
| 8,206,103 | B2 * | 6/2012 | Sun ............................ | 415/213.1 |

* cited by examiner

*Primary Examiner* — Todd M Epps
(74) *Attorney, Agent, or Firm* — Novak Druce Connolly Bove + Quigg LLP

(57) ABSTRACT

A mounting apparatus includes a securing plate and a fan. The securing plate defines an engaging slot and a retaining slot. The fan includes a first sidewall attached to the securing plate. The first sidewall includes a first engaging member and a second engaging member. The first engaging member engages in the engaging slot, to prevent the fan from moving in a first direction substantially parallel to the securing plate. The second engaging member extends through the retaining slot from the front of the securing plate to the back of the securing plate, and engages with the securing plate, to prevent the fan from moving in a second direction substantially perpendicular to the securing plate.

17 Claims, 6 Drawing Sheets

10 116 114 112 116 1161 1163 30 32 332 33 31 50 1182 118

FAN MOUNTING APPARATUS FOR HEAT DISSIPATION

BACKGROUND

1. Technical Field

The present disclosure relates to fan mounting apparatuses, more particularly to a fan mounting apparatus for a computer system.

2. Description of Related Art

Computers generate a large amount of heat from various electrical elements. A fan may be used to dissipate the heat from the computer. The fan may be mounted to a computer case through a plurality of screws. However, such a mounting configuration is inconvenient for a user to assemble/disassemble the fan, and tools required for fan assembly/disassembly may be heavy and potentially dangerous for the user because of the delicate nature of the various electrical elements around the fan. Therefore, an improved fan mounting apparatus for a computer system is desired.

BRIEF DESCRIPTION OF THE DRAWINGS

Many aspects of the embodiments can be better understood with reference to the drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
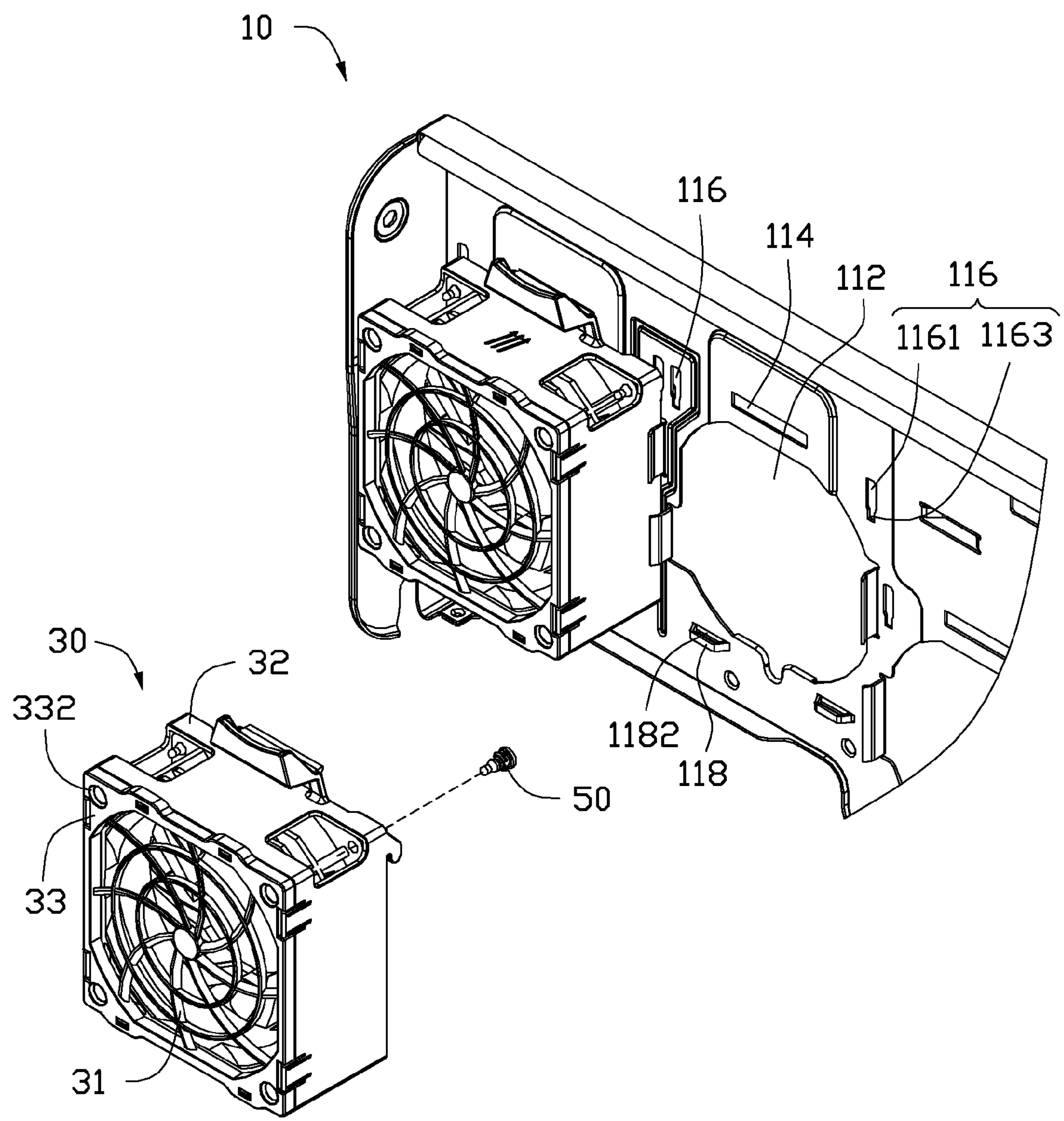
FIG. 1 is an exploded, isometric view of a fan mounting apparatus in accordance with an embodiment.
Figure 2:
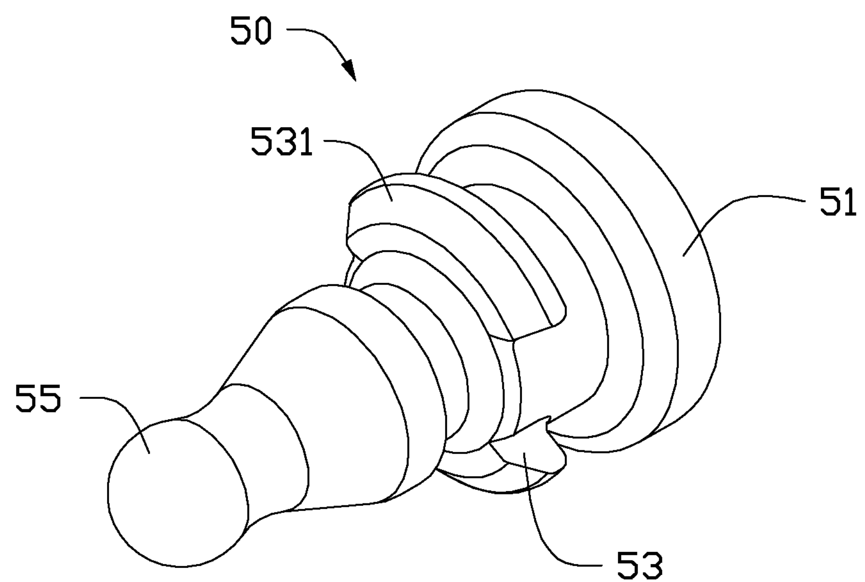
FIG. 2 is an isometric view of a vibration absorbing member of FIG. 1.
Figure 3:
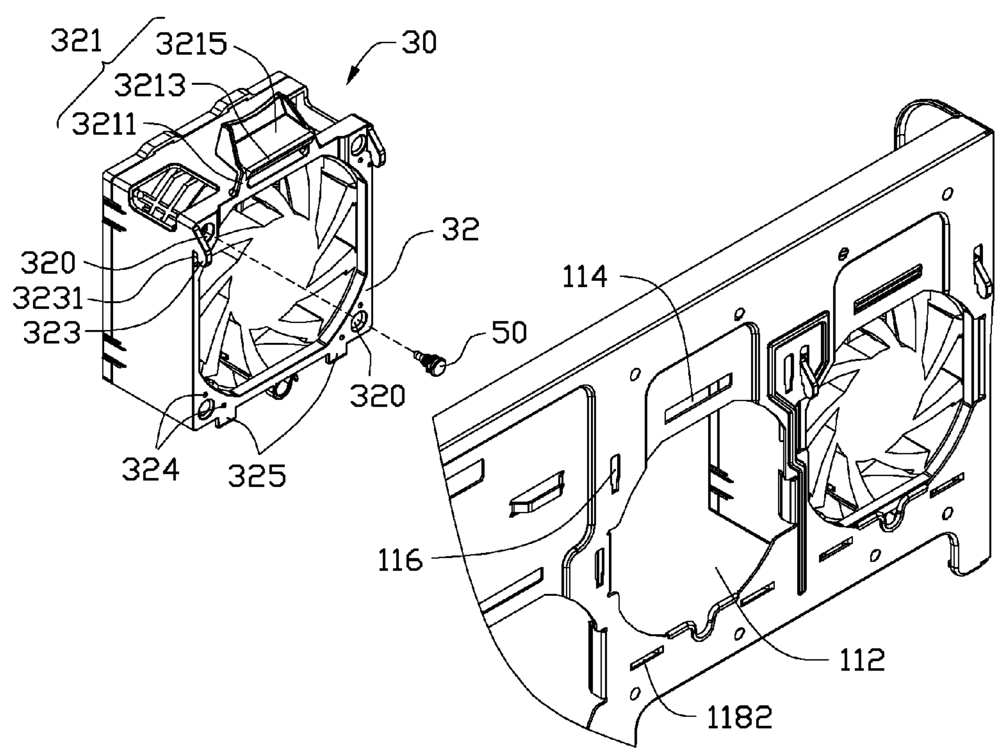
FIG. 3 is similar to FIG. 1, but viewed in a different aspect.

Referring to FIGS. 1 and 2, a mounting apparatus in accordance with an embodiment includes a securing plate 10 and two fans 30 attached to the securing plate 10. In one embodiment, the two fans 30 dissipate heat from a server.

A plurality of ventilation holes 112 is defined in the securing plate 10. In one embodiment, each of the plurality of ventilation holes 112 is side-by-side in a rectangular fashion. An engaging slot 114, two retaining slots 116, and two clipping holes 1182 are defined in the securing plate 15. In one embodiment, the engaging slot 114, each of the two retaining slots 116, and the two clipping holes 1182 surround each of the plurality of ventilation holes 112. An extending direction of the engaging slot 114 is substantially perpendicular to that of each of the two retaining slots 116. Each of the two retaining slots 116 includes a guiding portion 1161 and a retaining portion 1163 communicating with the guiding portion 1161. A width of the guiding portion 1161 is greater than that of the retaining portion 1163. In one embodiment, two clipping pieces 118 protrude from the securing plate 10, and each of the two clipping holes 1182 is defined between each of the two clipping pieces 118 and the securing plate 10.

Each of the two fans 30 defines a through hole 31 corresponding to each of the ventilation holes 112, and includes a first sidewall 32 and a second sidewall 33. Four first mounting holes 320 are defined in four corners of the first sidewall 32, and two resisting portions 324 are arranged on each of the four first mounting holes 320.

A first engaging member 321 extends from the top portion of the first sidewall 32, and two second engaging members 323 extend from the opposite edges of the first sidewall 32. The first engaging member 321 deforms slightly to engage in the engaging slot 114, and includes a connecting arm 3211, an operating portion 3215, and an engaging portion 3213. The engaging portion 3213 is located between the connecting arm 3211 and the operating portion 3215. In one embodiment, the engaging portion 3213 is triangular. Each of the two second engaging members 323 is substantially perpendicular to the first sidewall 32, and a receiving gap 3231 is defined between each of the two second engaging members 323 and the first sidewall 32. Two inserting pieces 325 extend from the bottom portion of the first sidewall 32. In one embodiment, the two inserting pieces 325 and the first sidewall 32 are coplanar.

Four second mounting holes 332 are defined in four corners of the first sidewall 32. A vibration absorbing member 50 can be received in each of the four first mounting holes 320 and each of the four second mounting holes 332. The vibration absorbing member 50 is configured to absorb vibrations. In one embodiment, the vibration absorbing member 50 is made of resilient materials, or other materials, which are capable of absorbing vibration.

The vibration absorbing member 50 includes a head 51, an extending portion 55, and a neck 53 connected to the head 51 and the extending portion 55. Two protrusions 531 are located on the neck 53, to closely engage in each of the four first mounting holes 320 or one of the four second mounting holes 332. In one embodiment, the extending portion 55 is nipple-shaped.

Figure 4:
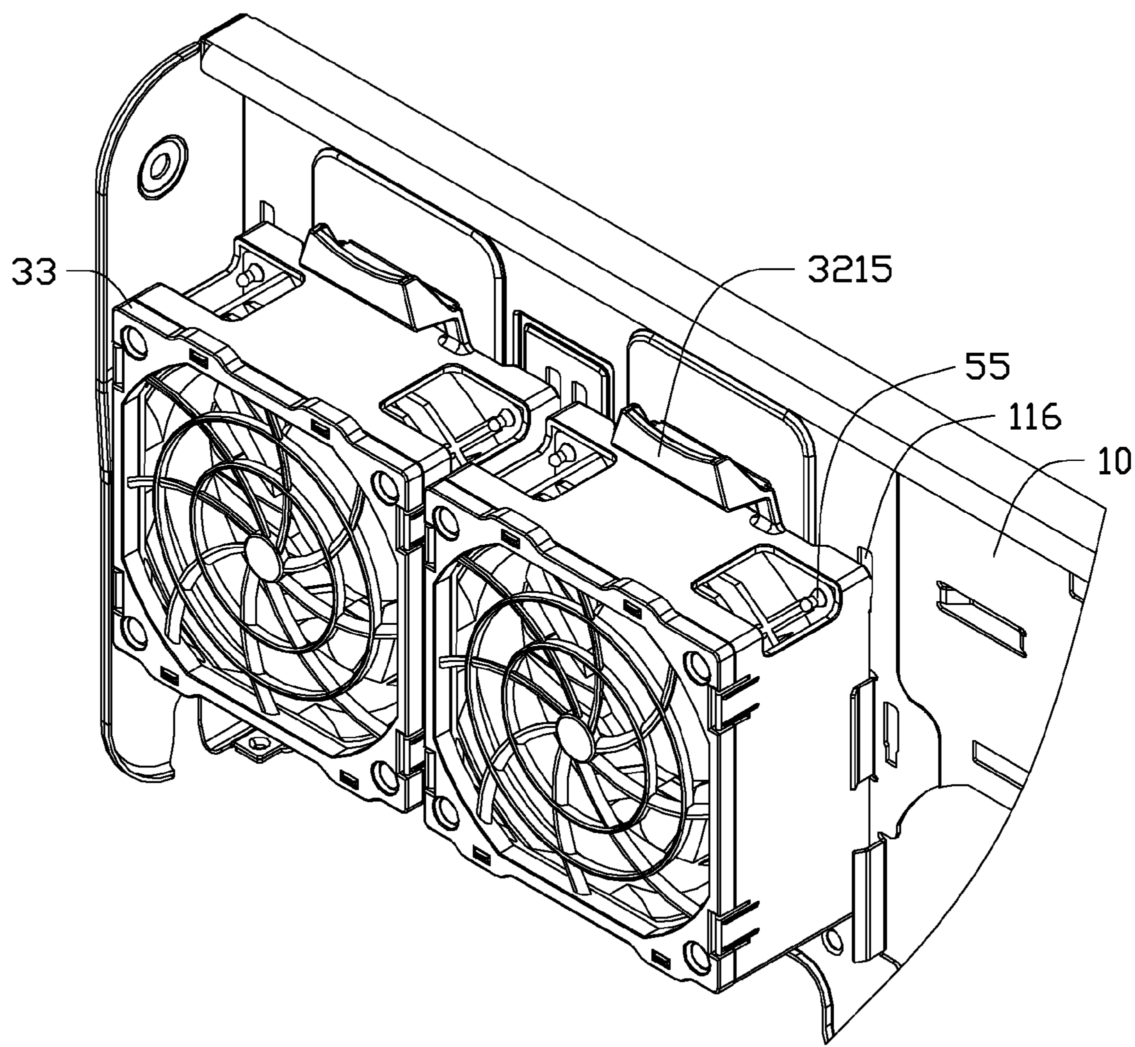
FIG. 4 is an assembled view of the fan mounting apparatus of FIG. 1.
Figure 5:
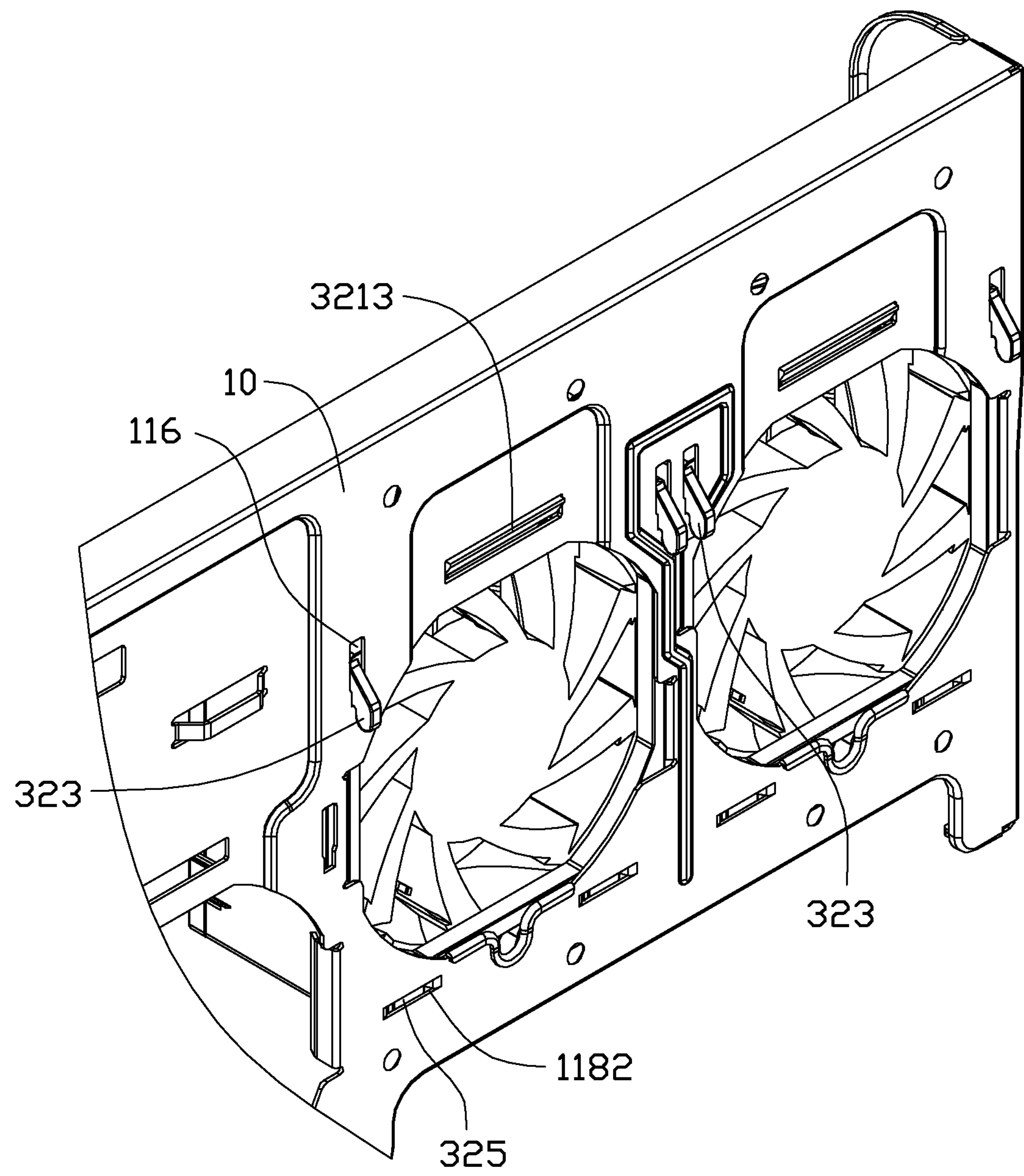
FIG. 5 is similar to FIG. 4, but viewed in a first different aspect.
Figure 6:
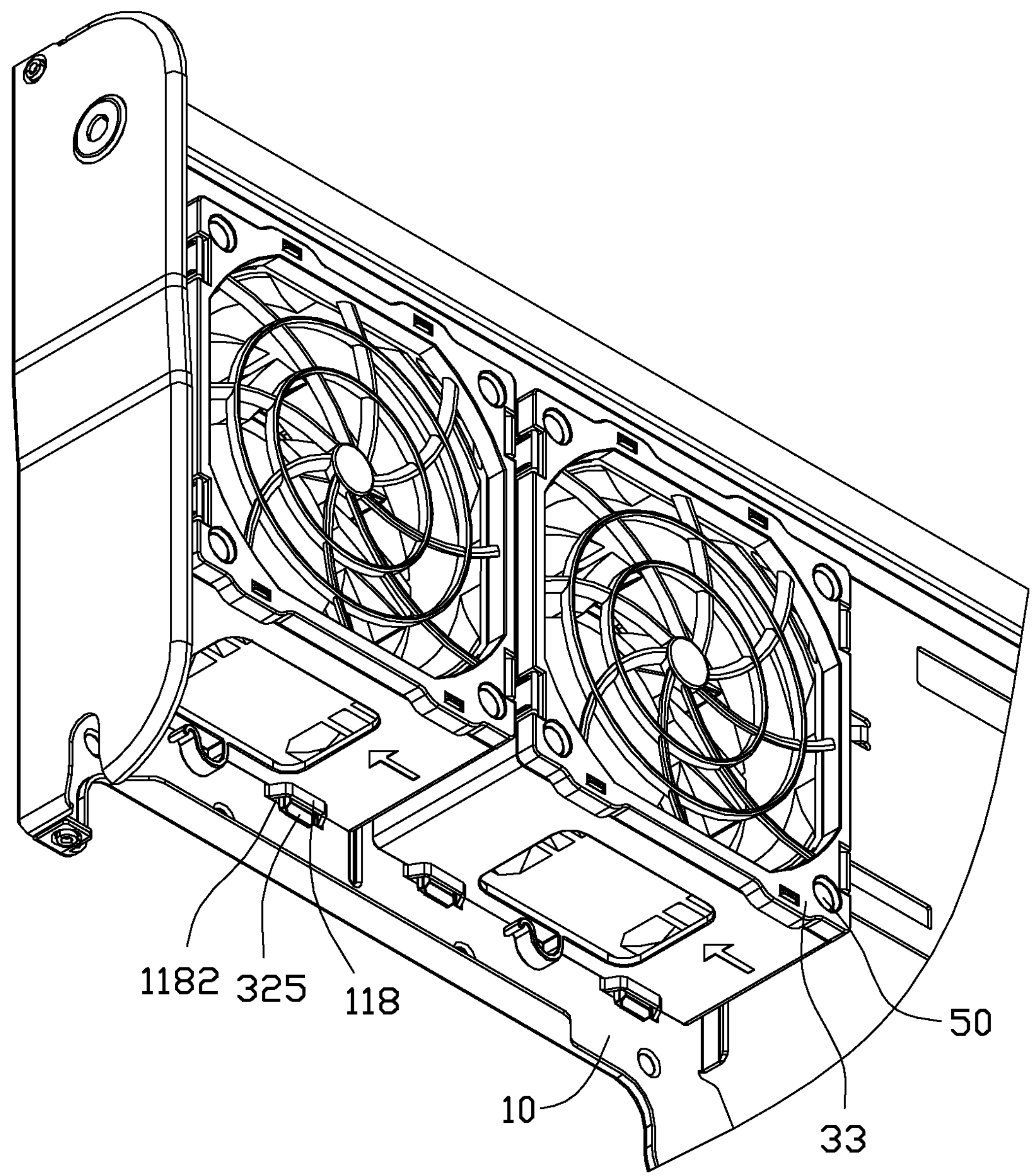
FIG. 6 is similar to FIG. 4, but viewed in a second different aspect.

Referring FIGS. 4-6, in assembly, one vibration absorbing member 50 is received in each of the four first mounting holes 320 and each of the four second mounting holes 332. The neck 53 is engaged in each of the four first mounting holes 320 or in one of the four second mounting holes 332, and the extending portion 55 is exposed out of one of the four first mounting holes 320 or one of the four second mounting holes 332.

Each of the two fans 30 is aligned with each of the plurality of ventilation holes 112, and the first sidewall 32 abuts the securing plate 10. The two second engaging members 323 are inserted into the guiding portions 1161. At this stage, the engaging portion 3213 is located above the engaging slot 114; and the two inserting pieces 325 are located above the two clipping holes 1182. Each of the two fans 30 is pressed down, the engaging portion 3213 deforms and engages in the engaging slot 114, and the two second engaging members 323 are located in the retaining portions 1163. The two inserting pieces 325 are engaged in the two clipping holes 1182, to secure each of the two fans 30 to the securing plate 10.

In disassembly, finger pressure can be used to deform the operating portion 3215, so that the engaging portion 3213 disengages from the engaging slot 114. Each of the two fans 30 is lifted up, to remove the two inserting pieces 325 from the two clipping holes 1182, and the two second engaging members 323 are slid to the guiding portion 1161. Each of the two fans 30 is moved away from the securing plate 10, to detach the two second engaging members 323 from the guiding portions 1131. Thereby, each of the two fans 30 is disengaged from the securing plate 10.

In one embodiment, when the two fans 30 are attached to the securing plate 11, the two protrusions 324 of the first sidewall 32 abut the securing plate 11, to decrease an acreage between the two fans 30 and the securing plate 11. Thus, the vibration frequency of the two fans 30 can be decreased.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and arrangement of parts within the principles of the disclosure to the full extent indicated by the broad general meaning of the terms in which the appended claims are expressed.

What is claimed is:

1. A mounting apparatus comprising:

a securing plate defining an engaging slot and a retaining slot; and a fan comprising a first sidewall attached to the securing plate; the first sidewall comprising a first engaging member and a second engaging member;

a clipping piece protrudes from the securing plate and defines a clipping hole, and an inserting piece extends from a bottom portion of the first sidewall and substantially parallel to the first sidewall; and the inserting piece is engaged in the clipping hole;

wherein the first engaging member is deformable to be engaged in the engaging slot to prevent the fan from moving in a first direction substantially parallel to the securing plate, and the second engaging member is engaged with the securing plate by extending through the retaining slot from a front to a back of the securing plate, and, the second engaging member prevents the fan from moving in a second direction substantially perpendicular to the securing plate.

2. The mounting apparatus of claim 1, wherein an extending direction of the engaging slot is substantially perpendicular to an extending direction of the retaining slot.

3. The mounting apparatus of claim 1, wherein the retaining slot comprises a guiding portion and a retaining portion communicating with the guiding portion, and a width of the retaining portion is less than a width of the guiding portion.

4. The mounting apparatus of claim 1, wherein the first engaging member comprises a connecting arm, an operating portion, and an engaging portion located between the connecting arm and the operating portion, and the engaging portion is engaged in the engaging slot.

5. The mounting apparatus of claim 1, wherein the second engaging member is substantially perpendicular to the securing plate, and a receiving gap is defined between the second engaging member and the first sidewall.

6. The mounting apparatus of claim 1, further comprising a vibration absorbing member separated from the first sidewall, the first sidewall defines a first mounting hole, and the vibration absorbing member is received in the first mounting hole.

7. The mounting apparatus of claim 6, wherein the vibration absorbing member comprises an extending portion and a neck located between the head and the extending portion, the neck is received in the first mounting hole, and the extending portion is exposed out of the first mounting hole.

8. The mounting apparatus of claim 7, wherein two protrusions are located on the neck to closely engage in the first mounting hole.

9. The mounting apparatus of claim 7, wherein the extending portion is nipple-shaped.

10. A mounting apparatus comprising:

a securing plate defining an engaging slot and a retaining slot; an extending direction of the engaging slot being substantially perpendicular to an extending direction of the retaining slot, and a clipping piece protruding from the securing plate and defining a clipping hole; and a fan comprising a first sidewall attached to the securing plate; the first sidewall comprising a first engaging member, a second engaging member,; an inserting piece extending from a bottom portion of the first sidewall and substantially parallel to the first sidewall; and the inserting piece is engaged in the clipping hole;

wherein the first engaging member is deformable to be engaged in the engaging slot; the second engaging member is engaged with the securing plate by extending through the retaining slot from a front to a back of the securing plate; and the second engaging member is slidable in the retaining slot to disengage the inserting piece from the clipping hole.

11. The mounting apparatus of claim 10, wherein the retaining slot comprises a guiding portion and a retaining portion communicating with the guiding portion, and a width of the retaining portion is less than a width of the guiding portion.

12. The mounting apparatus of claim 10, wherein the first engaging member comprises a connecting arm, an operating portion, and an engaging portion located between the connecting arm and the operating portion, and the engaging portion is engaged in the engaging slot.

13. The mounting apparatus of claim 10, wherein the second engaging member is substantially perpendicular to the securing plate, and a receiving gap is defined between the second engaging member and the first sidewall.

14. The mounting apparatus of claim 10, further comprising a vibration absorbing member separated from the first sidewall, the first sidewall defines a first mounting hole, and the vibration absorbing member is received in the first mounting hole.

15. The mounting apparatus of claim 14, wherein the vibration absorbing member comprises an extending portion and a neck located between the head and the extending portion, the neck is received in the first mounting hole, and the extending portion is exposed out of the first mounting hole.

16. The mounting apparatus of claim 15, wherein two protrusions are located on the neck to closely engage in the first mounting hole.

17. The mounting apparatus of claim 15, wherein the extending portion is nipple-shaped.

* * * * *